US005511127A

United States Patent [19]

Warnaka

[11] Patent Number: 5,511,127

[45] Date of Patent: Apr. 23, 1996

[54] ACTIVE NOISE CONTROL

[75] Inventor: Glenn E. Warnaka, State College, Pa.

[73] Assignee: Applied Acoustic Research, State College, Pa.

[21] Appl. No.: 680,982

[22] Filed: Apr. 5, 1991

[51] Int. Cl.$^{6}$ .......... H03B 29/00

[52] U.S. Cl. .......... 381/71; 381/94; 181/210; 181/224

[58] Field of Search .......... 381/71, 94; 181/210, 181/212, 224

[56] References Cited

U.S. PATENT DOCUMENTS

| | | | |
|---|---|---|---|
| 3,936,606 | 2/1976 | Wanke | 179/1 |
| 4,044,203 | 8/1977 | Swinbanks | 179/1 |
| 4,122,303 | 10/1978 | Chaplin et al. | 179/1 |
| 4,480,333 | 10/1984 | Ross | 381/71 |
| 4,594,695 | 6/1986 | Garconnat et al. | 367/135 |
| 4,665,549 | 5/1987 | Eriksson et al. | 381/71 |
| 4,689,821 | 8/1987 | Salihuddin et al. | 381/71 |
| 4,783,817 | 11/1988 | Hameda et al. | 381/71 |
| 4,805,733 | 2/1989 | Kato et al. | 181/206 |
| 4,815,139 | 3/1989 | Eriksson et al. | 381/71 |
| 5,010,576 | 4/1991 | Hill | 381/71 |
| 5,097,923 | 3/1992 | Ziegler et al. | 181/206 |

FOREIGN PATENT DOCUMENTS

| | | | |
|---|---|---|---|
| 313996 | 1/1991 | Japan | 381/71 |
| 313997 | 1/1991 | Japan | 381/71 |

*Primary Examiner*—John K. Peng
*Assistant Examiner*—Edward Lefkowitz

[57] ABSTRACT

A system for reducing noise of a noise generator such as a fan located in a housing includes a short duct directing air to the fan housing. An input transducer is located in the duct at a position further removed from the fan than a cancellation noise source which is also located in the duct. An electronic controller with embedded frequencies related to the steady state operation of the fan inputs cancellation signals to the cancellation source. The input transducer also responds to the random noise of the fan to provide control signals to the controller for generating signals for the cancellation source. The input duct can be multi-cellular with respect of the input transducer and the cancellation source.

17 Claims, 7 Drawing Sheets

ACTIVE NOISE CONTROL

BACKGROUND

The reduction of noise is important to improve environmental conditions.

This invention relates to the reduction of undesirable noise generated by a wide variety of sources. In particular, this invention is advantageously utilized to reduce undesirable noise generated by fans in industrial and utility applications. Usually such fans run under relatively steady state conditions.

Many techniques and systems are known for reducing noise generated by noise generators such as fans. The generation of noise is, of course, a consequence of the normal effective operation of machinery such as a fan. The term "noise generator" is used to broadly mean a mechanical operative item which, as a result of its operation, generates noise. The known systems invariably require a transducer located in the vicinity of the noise generator, cancellation means located in the vicinity of the noise transducer and an electronic controller between the transducer and the cancellation means. According to the noise generated by the transducer, suitable signals are caused to be generated by the controller means to the cancellation means. The signals generate a noise pattern to counteract the effect of the noise generated by the noise generator.

Unfortunately, the known systems for reducing the noise of the noise generators often require multiple transducers located in relatively harsh environments relative to the noise generator. Also, the electronic controller is not often tuned to provide the best anti-noise control to the system.

It is accordingly an object to the present invention to provide a system for reducing the noise of a noise generator such as a fan, in a manner which is improved over the prior art techniques.

SUMMARY

By this invention, there is provided a system for active noise control to reduce the noise of a noise generator.

According to the invention, there is provided an apparatus, system, and method for actively reducing the noise of a noise generator. Preferably, the noise generator is the fan located in a fan housing. A duct directs air through the housing and the duct length is preferably no greater than about two wavelengths of the nominal blade passage frequency of the fan when operative under essentially steady state conditions.

Input transducer means in the duct senses the noise and cancellation means in the duct attenuates or counteracts the noise. An electronic controller means is responsive to the input transducer means for providing a cancellation signal to the cancellation means.

The duct is preferably an inlet duct to the housing and is preferably multi-cellular in cross-section. Preferably, the cells are constructed between radial walls directed from a central axis of the duct to the circumferential wall of the duct.

The input transducers and cancellation means are located circumferentially around the duct for each cell. A single transducer for each cell is located in a position further removed from the fan than a cancellation means for cell.

The controller means provides a cancellation signal at predetermined frequencies, the frequencies including a fundamental frequency and selected harmonics of that frequency.

The invention is now further described with reference to the accompanying drawings.

DRAWINGS

FIG. 1 is a prior art diagrammatic view illustrating the relationship of transducer means and cancellation means in a duct.

FIG. 2*a* is a forced draft fan air inlet section of a duct showing a multi-cellular cross-sectional arrangement to a duct for a fan according to the invention.

FIG. 2*b* is an elevational view of the air inlet according to the invention.

FIG. 3*a* is a diagrammatic elevation of a fan illustrating component parts of the invention in an inlet duct to a fan.

FIG. 3*b* is an end view of the fan illustrating the multi-cellular structure in the inlet duct.

FIG. 8(*a*) is without cancellation.

DESCRIPTION

Figure 1:
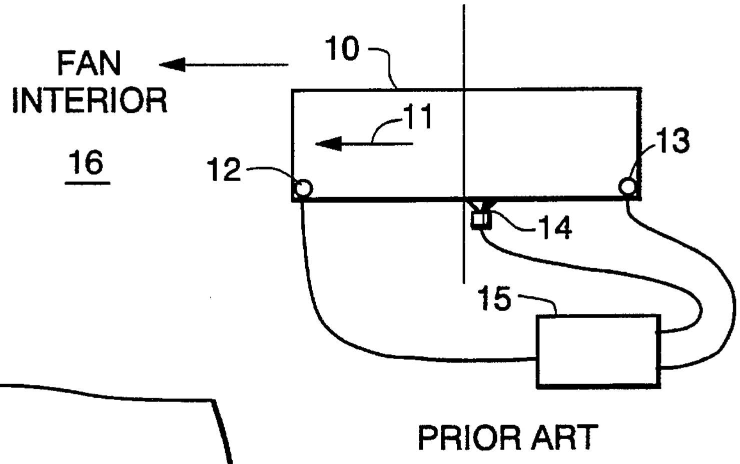

An active noise control system for reducing noise of a fan as illustrated in the prior art is diagrammatically represented in FIG. 1. A duct 10 through which air flows into a fan, as indicated by arrow 11, has a transducer 12 located downstream relative to the air flow and a second transducer 13 located upstream in relation to the air flow. Between these two transducers, there is located a cancellation means 14. The transducers 12 and 13 which are microphones are connected with an electronic controller means 15 which receives input from the transducers 12 and 13 and provides a cancellation signal to the cancellation means 14.

In the prior art structure of FIG. 1, the transducer 12 is often located close by the fan interior as indicated generally on numeral 16. The closer the location to the fan interior, the harsher is the environment. Accordingly, the transducer 12 needs to be more rugged and more expensive. In order to obtain a suitable cancellation signal, the prior art has adopted an approach of using the two transducers 12 and 13 to either side of the cancellation means 14.

Figure 6:
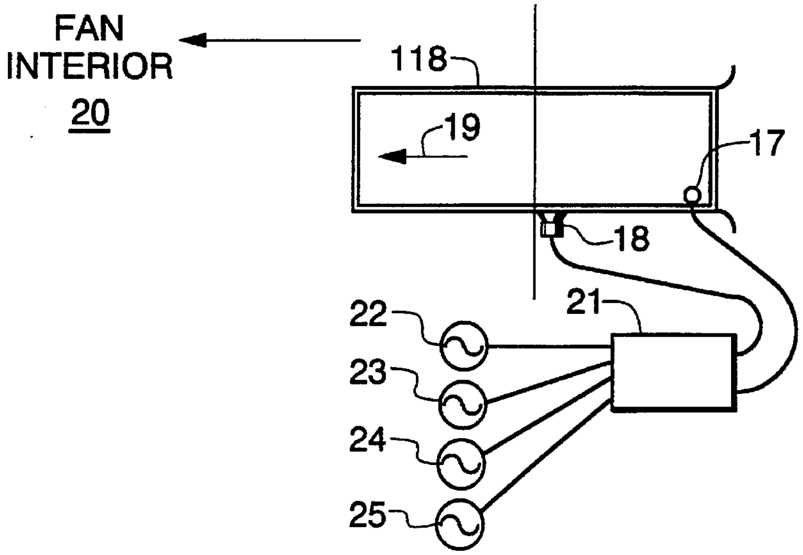
FIG. 6 is a diagrammatic view of the invention illustrating an inlet duct with a controller, single transducer means and single cancellation means. The transducer means is further removed from the fan interior than the cancellation means, and the controller has embedded frequencies.

As illustrated diagrammatically in FIG. 6, one form of the present invention uses only a single transducer 17 located upstream in the duct 118 which directs air according to arrow 19 towards the fan interior 20. The noise travels in an opposite direction to the inflowing air. A cancellation means 18 is located between the fan interior and the transducer means. The transducer means 17 is more removed from the fan interior 20 relative to the location of the cancellation means 18. The electronic controller 21 is connected between the transducers 17 and the cancellation means 18 to provide a cancellation signal.

Also indicated in FIG. 6 is the characteristic of embedded frequencies 22, 23, 24 and 25 which are contained within the electronic controller 21. The embedded frequencies are measured frequencies which are related to the essentially steady state operative conditions of the fan. The frequency 22 is the nominal fan frequency. This is the blade passage frequency of the fan, which will be defined below. The embedded frequencies 23, 24 and 25 are selected harmonics such as the second, third and fourth harmonic frequencies of the blade passage frequency.

Figure 2A:
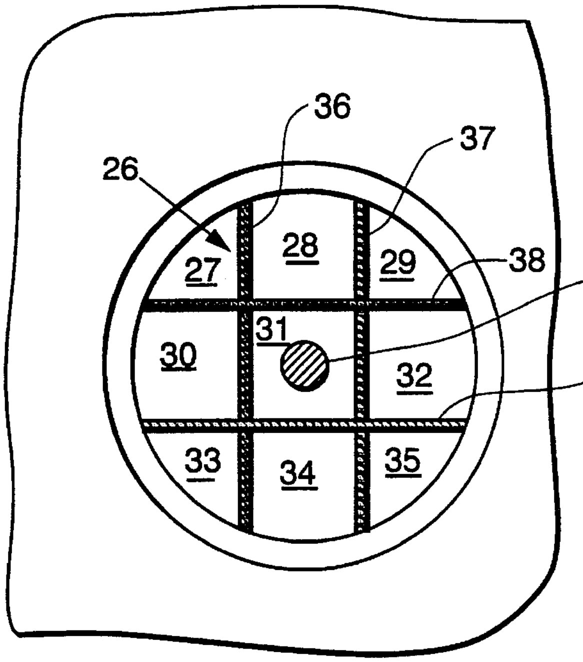

In FIG. 2*a*, there is illustrated an active noise cancellation system forced draft fan air inlet with the air inlet 26 illustrated in section. The air inlet 26 is configured into a multi-cellular arrangement 27, 28, 29, 30, 31, 32, 33, 34 and 35. Intersecting vertical walls 36 and 37 and horizontal walls 38 and 39 across the air inlet 26 form the cellular constructions 27 through 35. The central axis rotating shaft 40 of the fan is located in the central cellular region 31. It does not necessarily extend all the way through the shafts.

Figure 2B:
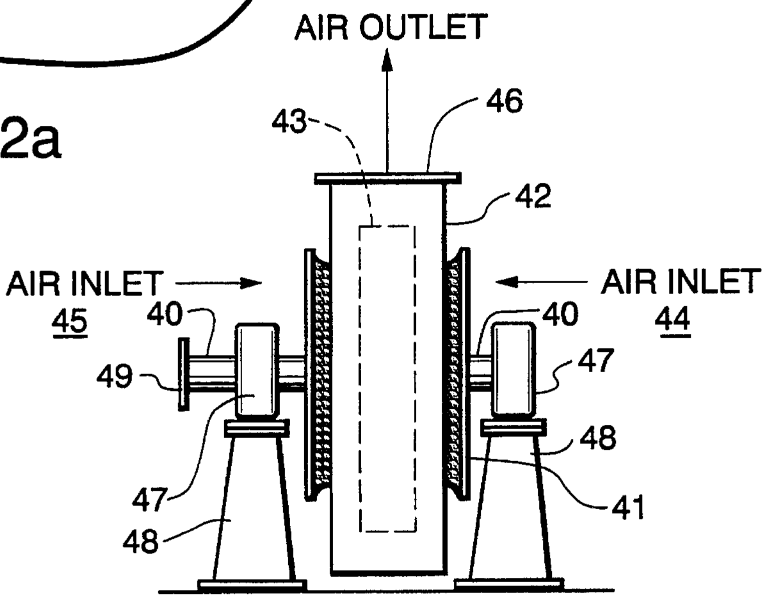

Referring to both FIGS. 2*a* and 2*b*, the vertical walls 36 and 37 and horizontal wall 38 and 39 are located in the inlet duct 41 to the housing 42 for a fan 43. The fan is diagrammatically illustrated in FIG. 2*b* and is typically a centrifugal fan with blades that rotate on shaft 40. As illustrated in FIG. 2*b*, there are inlets 44 and 45 to either transverse end of the fan 43 and the outlet 46 is tangentially arranged. In the illustrated embodiment of FIGS. 2*a* and 2*b*, cellular structures are located at both air inlets 44 and 45. The shaft 40 is suitably mounted in bearings 47 spaced to either side of the housing 42. The bearings 47 are located on pedestals 48 and suitable motive means would drive the fan through the coupling 49 fixed to shaft 40.

Figure 3A:
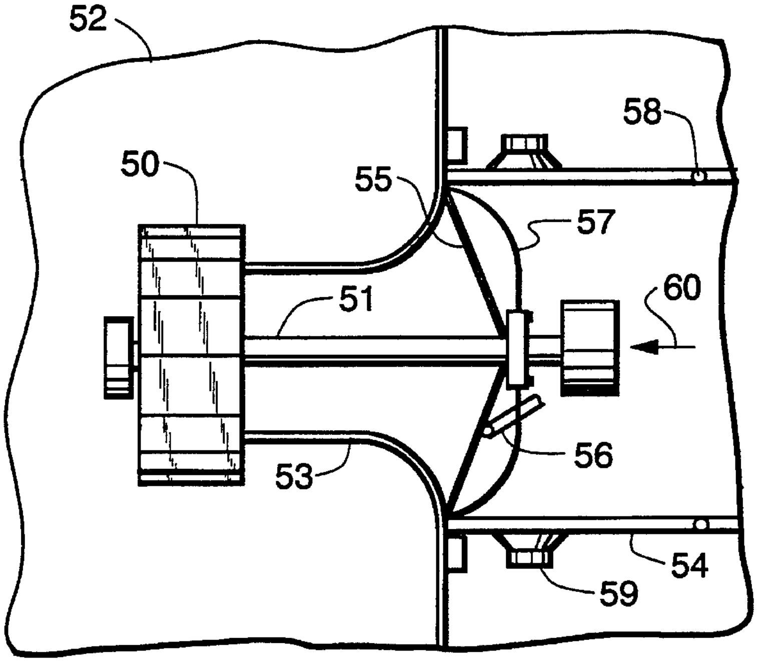
Figure 3B:
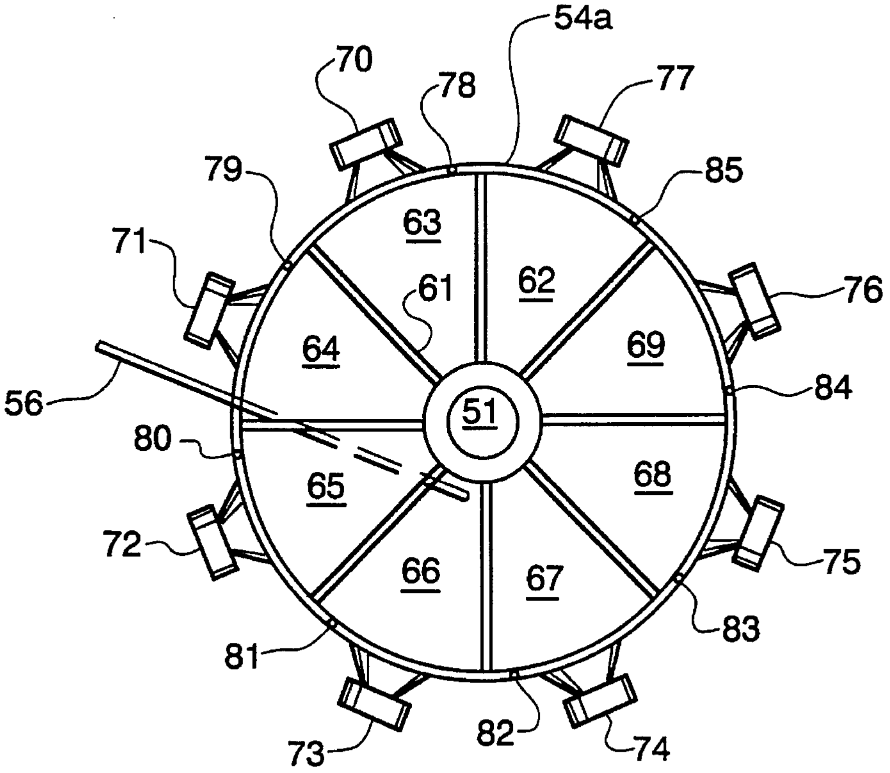

The different configuration of fan structure is shown in FIGS. 3*a* and 3*b*. In FIG. 3*a*, a cross-sectional elevational view shows a fan 50 mounted on a shaft 51. The centrifugal fan 50 operates to drive air tangentially outwardly from a housing 52 from an outlet.

An inlet fluid duct construction 53 is provided on the one side of the fan and upstream, the duct construction 53, is a further duct configuration 54 which mates with the inlet duct construction 53. In the configuration illustrated, construction 53 is essentially part of the housing configuration 52 which surrounds the fan unit 50. The inlet duct is a circular, cross-sectional duct which mates with the fluid inlet 53 of the fan housing and may be affixed to fan housing 52 or inlet 53. At the inlet to the fan housing 53 are radially arranged shutters 55 which are operative by a rod 56 to open and close and thereby control the amount of air passing into the fan 50. Upstream of the shutters 50 is a cage 57 which serves as a protection to the fan inlet. The rod 56 passes through the cage 57 suitably so as to operate the shutters 55.

In the inlet duct 54, there is located a microphone or transducer 58 and a cancellation means or speaker 59. These elements are located in the wall of the duct 54 so as not to impair the inflow of air as indicated by arrow 60 through the duct 54.

The radial walls 61 are arranged between a circumferential inner wall 62 and the circumferential outer wall 54. The radial walls 61 effectively appear as spokes when viewed in cross-section and between the outer wall 54, inner wall 62 and radial walls 61, there are constituted a multi-cellular construction 63, 64, 65, 66, 67, 68, 69 and 69*a*. The cellular constructions, when viewed in cross-section, form regions which are pie-shape type configurations for the inflow of air to the fan housing 53.

Around the outer wall 54 indicated and within the walls 54*a* of the inlet duct 54, there are respectively speakers 70, 71, 72, 73, 74, 75, 76 and 77. Each of these speakers services a particular respective cell 63 through 69, respectively and provides a cancellation signal to each of the cells. Similarly, a microphone 78, 79, 80, 81, 82, 83, 84, 85 and 86 is provided for each of the cells. The microphones act as input transducers in the duct to sense the noise. From the transducers, a signal is directed to the electronic controller 21 which is responsive to the input transducer means to provide a cancellation signal to the speakers. The controller 21 is configured to have channels responsive to each of the transducers 78 through 86 and to provide respective cancellation signals to each of the cancellation means 70 and 77, respectively.

The controller means is set up with embedded frequencies so as to provide an appropriate cancellation signal. The predetermined discrete frequencies in the controller is the nominal frequency or blade passage frequency of the fan and selected harmonics of that frequency. The blade passage frequency is determined according to the formula $$\text{Blade Passage Frequency} = \frac{\text{fan rotation in RPM} \times \text{number of blades on fan}}{60}$$

Harmonics are the second, third and fourth or any other harmonic of this blade passage frequency which is desirable. The controller 21 is electronically set-up so as to remove the tonal components of the blade passage frequency of the fan 50.

Figure 4:
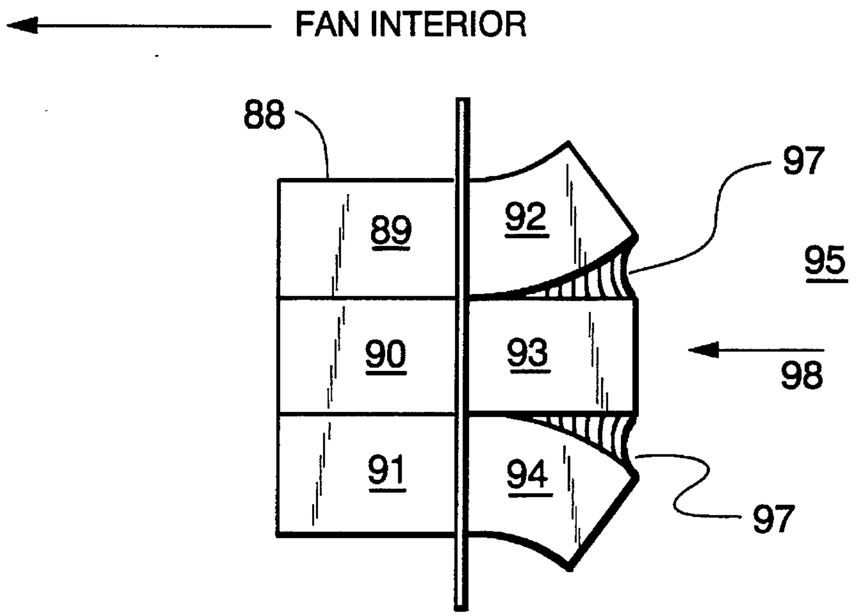
FIG. 4 is an elevational view of an alternative inventive structure showing cells to the inlet duct of a fan.
Figure 5:
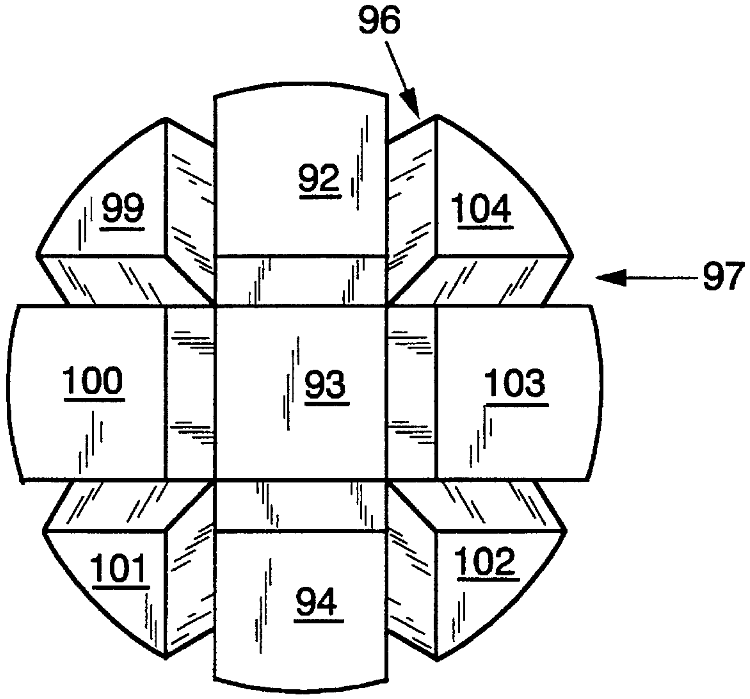
FIG. 5 is an end view of the cellular arrangement shown in FIG. 4.

In FIG. 4, there is illustrated a multi-cellular arrangement for an inlet duct 88 where the cells 89, 90 and 91, respectively are flared at the upstream ends 92, 93 and 94. The upstream ends are located at the inlet 95 to the duct. Between the cellular inlets 92, 93 and 94, there is a wall construction 96 and 97. The wall construction 96 is vertically arranged and the wall construction 97 is horizontally arranged. Suitable transducers 17 and cancellation means 18 can be located in these constructions. In this fashion, the transducers 17 and 18 do not impair the inflow of air as indicated by arrow 98 to the duct 88. The flared or curved sections 92 and 94 are gentle and conform to a construction to facilitate air flow into the duct 88. Different flair formations 99, 100, 101, 102, 103 and 104 are located around the perimeter of the inlet 95. The flared formations 92 and 94 are almost square in cross-section as are the sections 100 and 103. The flared formations 99, 101, 102 and 104 are pie-shaped sections. The central cross-sectional multi-cellular area 93 is a truly configured square configuration.

By having this construction of the cancellation means and transducer input means in the outside perimeters of the multi-cellular construction, there is a minimized drag to the air inflow through the duct 54. Similarly, the radial spokes 61 or the walls 96 and 97 are configured so as to minimize drag on air flow through the duct.

Figure 7:
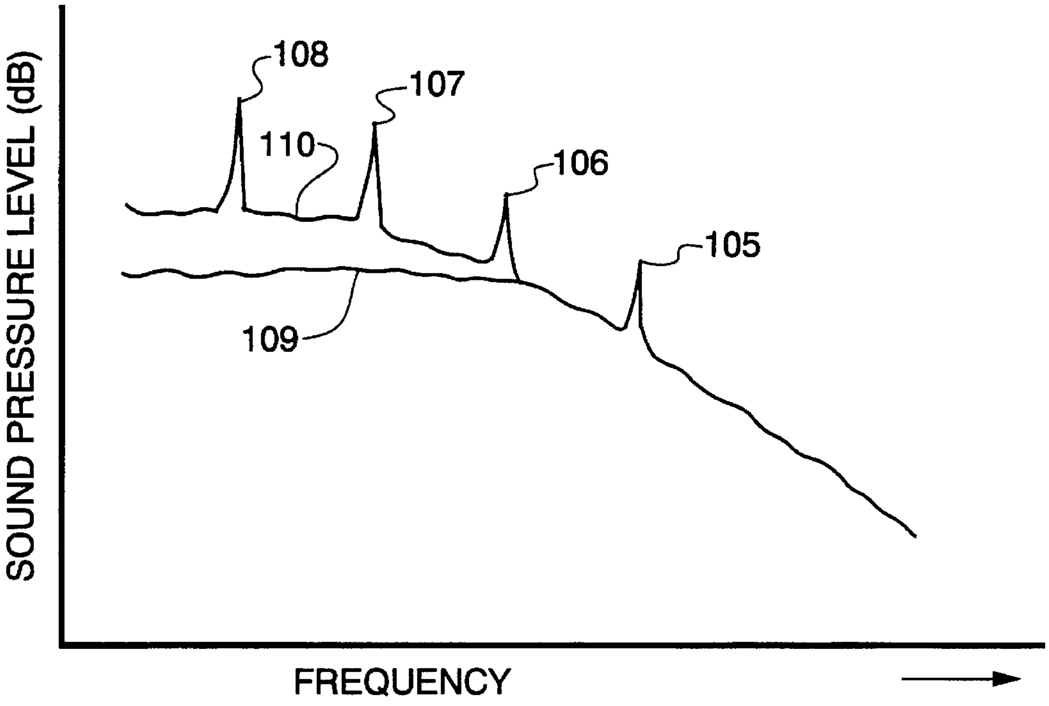
FIG. 7 is a diagrammatic graphical illustration showing the sound pressure level at different frequencies, the tonal components of the blade passage frequency and the random flow of noise distribution at different frequencies.

In FIG. 7, the diagrammatic illustration indicates the tonal components of blade frequency where the nominal frequency or blade passage frequency is indicated by the peak 108. The second harmonic is indicated by peak 107, the third harmonic is peak 106 and the fourth harmonic is peak 105. By knowing the characteristics of the fan 50 operable in its housing 52, these tonal components are measured and embedded within the controller 21. In this manner, only a single transducer 17 needs to be located in the inlet duct 118 for each of the respective cells. The requirement of an inlet transducer closer to the fan housing is thereby avoided. By programming the controller 21 appropriately, the tonal components of the blade passage frequency are canceled during essentially steady state normal operation of the fan. Additionally, the controller 21 is programmed to remove random noise. This is indicated by the line 109 which indicates a reduction from the uncancelled noise condition 110. This reduction is at the lower frequency range of the frequency noise spectrum of the fan 50.

Figure 9:
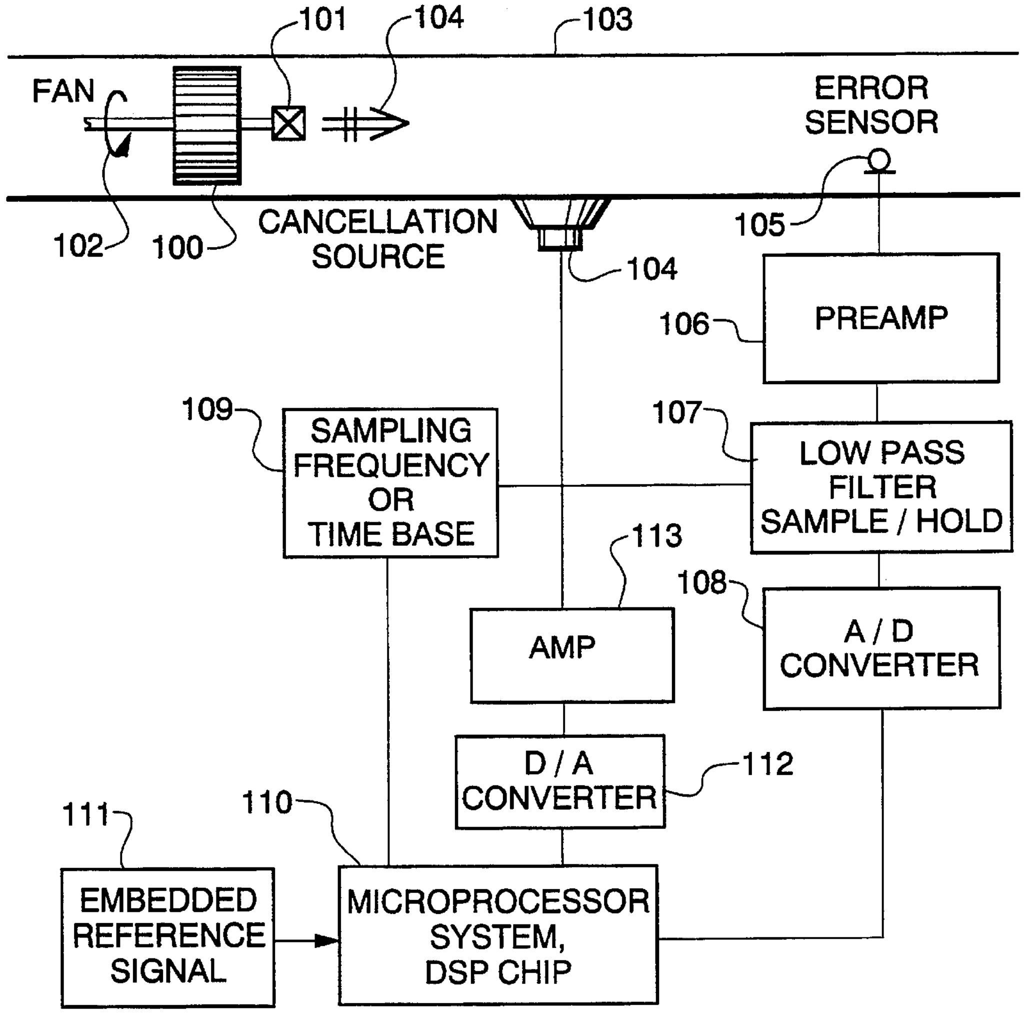
FIG. 9 is a diagrammatic block view illustrating details of the electronic controller means in relationship with a duct.

In FIG. 9, there is illustrated the basic components of the electronic controller 21. The flow diagram of the controller has different channels for each respective cell.

The controller 21 is illustrated in a flow block diagram form in relationship to the fan 120 which is diagrammatically illustrated.

The motive means 121 is illustrated for turning the fan as indicated by rotational arrow 122. The noise from the fan promulgates down an inlet duct 123 as indicated by arrow 124. The cancellation source 135 is located in the perimeter of the inlet duct 123 closer to the fan 120 than is an error sensor microphonal transducer 125. As indicated, the transducer 125 essentially senses the noise signal in the duct 123 as an error type signal. The signal is directed to a pre-amplifying circuit 126 and from the pre-amp 126, the signal is directed to a low pass filter sample and hold circuit 127. From circuit 127, the signal is directed to an A/D converter circuit 128 and also to a circuit for sampling frequency or generating a time base 129. The signals from the converter 128 and the frequency sampler 129 are directed to a microprocessor system DSP chip such as, but not limited to, Texas Instruments' TMS 32010, TMS 320C25, TMS 320C30 or Motorola's DSP 56001.

Also fed to the microprocessor system 130 are reference signals from an embedded reference signal source 131. The embedded reference signal source has stored in it signals at discrete frequencies which can be the blade passage frequency and harmonics of that frequency. The output from the microprocessor system is directed to a D/A converter 132 and the output from the converter is directed to an amplifier 133 which transmits the cancellation signal to the cancellation means 135.

When the transducer 125 senses noise, it is transmitted through the circuitry as described. The microprocessor system 130 acts to receive the embedded reference signals in accordance with the dictates of the microprocessor. In this manner, the microprocessor is programmed to remove the noise signals at discrete frequencies.

The embedded reference signal may take many forms, for instance, a tape recording of the signal may be made when the fan operates under normal steady state conditions and this tape recorded signal can be programmed into the microprocessor system to be used as the embedded reference signal. The tape recorder would present a recording of the actual noise source to the electronic controller and the controller would compare the recorded signal with that from the error sensor or transducer 125 and thereby provide proper cancellation. Other methods of providing the embedded reference signal would be to use an oscillator, frequency synthesizer or waveform generator. The embedded reference signal might include a primary frequency or tone which could then be applied to appropriate frequency multipliers and/or dividers to produce the required waveform to be canceled. The embedded reference signal applies to repetitive noise since this is one waveform of noise which constantly repeats itself as a function of time. The class of repetitive noise may include tones or sine waves or harmonic noise.

The above description has been related with the embedded frequency reference being discrete frequencies 22, 23, 24 and 25 which are constant. In different situations of the invention, the embedded reference frequencies 22, 23, 24 and 25 can be variable. Such applications would be applicable to noise generators which are not normally constant in speed. The embedded sources can be variable in frequency and can provide a variable input that allows the active noise reduction system to cancel noise as the characteristics or speed of the noise generator changes.

In particular, where the fan has variable speed characteristics, the noise of the fan may be recorded at the mid-point of its speed range. The tape recording is then played on a variable speed drive tape recorder that, when the fan is operated at the mid-point of its speed range, the tape recorder playback speed is the same as the original recording speed and this serves as an embedded reference signal or frequency. Should the speed of the fan be lowered, the playback speed of the tape recorder is likewise lowered to create a proper embedded reference source. Should the speed of the fan increase, the playback speed of the tape recorder may be similarly increased to create a proper embedded reference source.

Other examples of variable embedded frequency sources include VCOs (voltage controlled oscillators), variable frequency synthesizers, variable oscillators, and variable wave form generators. In each situation, the controller would vary the frequency, and also the phase of the cancellation source to hold the phase difference to a minimum while varying the amplitude of the cancellation source to produce a minimum error signal.

The same result is achieved by employing a series of single frequency references with increasing and/or decreasing frequencies. The controller would then select the reference which minimizes the error signal by "stepping" up or down among the frequencies available. Alternatively, the embedded reference signal could be provided by a device capable of increasing or decreasing its frequency in the required discrete steps.

The active noise control system is used for reducing the noise of a noise generator such as a fan, particularly large fans which are used in industrial applications. The noise control system can be operative for reducing noise of the inlet and/or exhaust noise of the fans. The system is configured to cause minimum change or disruption of the flow of air or other fluid through the fan.

By subdividing the duct into a short, multi-cellular duct 54, the noise created by the flow is easier to control. The cancellation source means 59 which is located in the outside circumference of the duct can also be located on more than one wall, for instance the transverse walls 96 or 97.

More than one cancellation means 18 can be provided for each of the cells. A finely tuned proper cancellation signal can thus be provided to the speaker 18 for each of the cells. The multi-cellular configuration can be configured either in the added duct portion in relation to the housing 52 of the fan 50 or can be in the inlet portion of the housing or fan case. The multi-cellular configuration can be square, round or other cross-sectional shapes so as to facilitate the mechanical configuration and flow of fluid through the fan.

By having the axial length of the duct 54 relatively short and thereby having the axial length of the multi-cellular configurations 63 through 69 relatively short, the drag forces on the walls forming the multi-cellular configurations are reduced. Additionally, the number of cells should be as few as possible so as to reduce obstructions to the flow. On the other hand, the cells should be sufficiently high in number to provide for adequate division of the noise to permit tuning of the controller 21 to minimize and reduce noise effectively.

Additionally, the material of the duct is made as thin as possible so as to reduce obstruction to flow. The duct should not contain any obstructional restriction and should be free of passive, sound-absorbing liners which could obstruct the flow. Thus, the material of the duct should be hard, smooth material such as metal or plastic which could further facilitate flow through the duct.

In order to reduce the flow resistance of the duct even more, a bell, or other smoothly convergent structure to reduce the overall pressure loss of the configuration, may be added to the open end or mouth of the duct, that is, the end of the duct that is farthest away from the noise generator, or said duct end may be shaped in the form of a smoothly convergent structure such as a bell end. The purpose of having such a bell-shaped mouth is to provide a smoother transition for the flow of air and to reduce the turbulence at the interface of the moving and still air. At the same time, the bell-mouth structure also reduces the build-up of a pressure wave at the end of the duct. The pressure wave also reduces the flow into the duct, and when it is reduced the resistance to flow through the duct is diminished.

Noise produced by both axial and centrifugal fans consists of tonal components produced by the frequency of the blade passage and its harmonics. In addition, fans produce a broadbanded, random noise associated with air flow. This is illustrated in FIG. 7. The control system 21 is configured to attenuate the tonal components as is indicated in FIG. 7. The tonal components of the noise produced by the blade passage frequencies are produced inside the fan housing 52 and propagate outward through the inlet or exhaust or outlet ports of the fan 50. These tonal components may be attenuated by comparing the signals of the input transducers 17 and adjusting the sound pressure output and phase of the canceling means 18 to produce an acoustic null at positions further removed from the fan 50. This would produce an overall global attenuation of the noise. In some cases it may be advisable to locate transducer or microphone 17 outside the duct 54 or to use a network of transducers in order to provide the maximum silencing that is technically possible.

For fans operating at nominally constant speed, the upstream input transducer (FIG. 1, transducer 12) is avoided. Instead, an electronic frequency reference with the blade passage frequencies 22 and harmonics as indicated by frequency sources 23, 24 and 25 corresponding to unwanted blade passage frequency components is directed into or embedded within the electronic controller means 21. The electronic controller 21 is programmed to adjust the sound pressure output and phase of the canceling means 18 by comparing the electronic frequency input as determined by the embedded frequencies 22 through 25 of the controller with the input from the downstream transducer 17. The controller 21 is configured to compensate for reasonable frequency and phase differences between the fan speed and the blade passage frequencies so that normal variations in fan speed can be accommodated.

Generally, the tonal components 105 through 108 of the fan noise produced by the blade passage frequency represents the highest sound pressure, namely, greatest magnitude, output from the fan 50. These components 105 through 108 as illustrated in FIG. 7 are the most annoying aspect of fan noise and propagate to the greatest distance because of their repetitive, reinforcing nature and relatively low frequency.

The accomplishment of the simultaneous, active attenuation of the tonal noise can be effected with an electronic controller 21 for each of the cells in the configuration which adopts a multi-cellular approach. If there is a single inlet duct, a single controller can be applicable to the duct. For each cell, there may be two controllers 21. The first controller 21 can attenuate the tonal frequencies 105 to 108 and the second controller 21 acts to attenuate the random noise 110. If the controller 21 operates at a sufficiently high speed and the noise is stationary relative to time, the signals from the various cells 63 through 69 can be multiplexed so that a single controller 21 can provide a cancellation signal to several or all of the cells 63 through 69. If the controller 21 is rendered sufficiently complex, then a single control system can be configured to attenuate both the tonal noise 105 to 108 and the random noise 110. The nature of the noise and the system reliability, are factors to be considered in determining the exact configuration of controller 21 for each application.

Figure 8A:
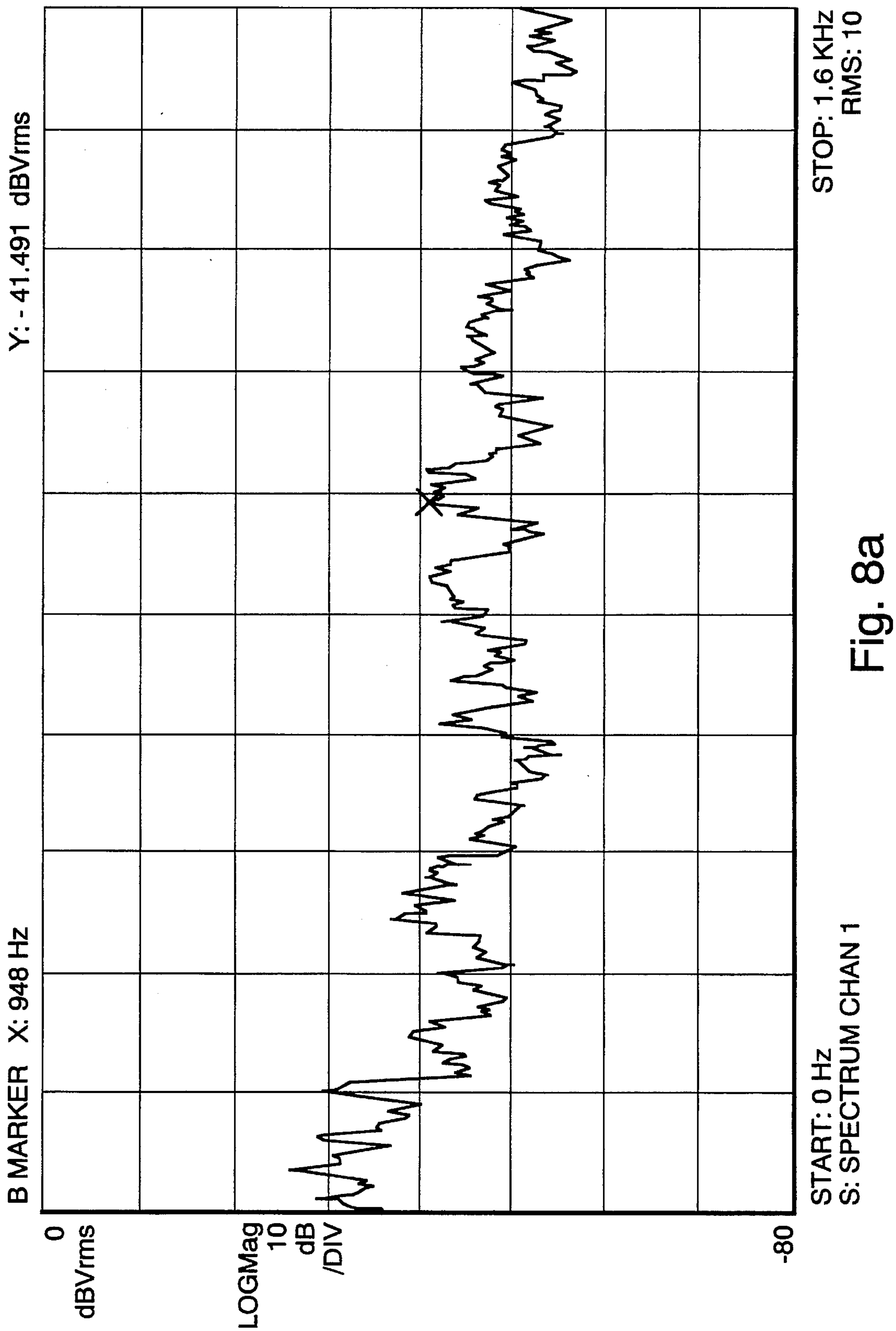
FIG. 8 is a graphical illustration of the application of the invention showing the sound pressure level against the frequency, with the cancellation means operative.
Figure 8B:
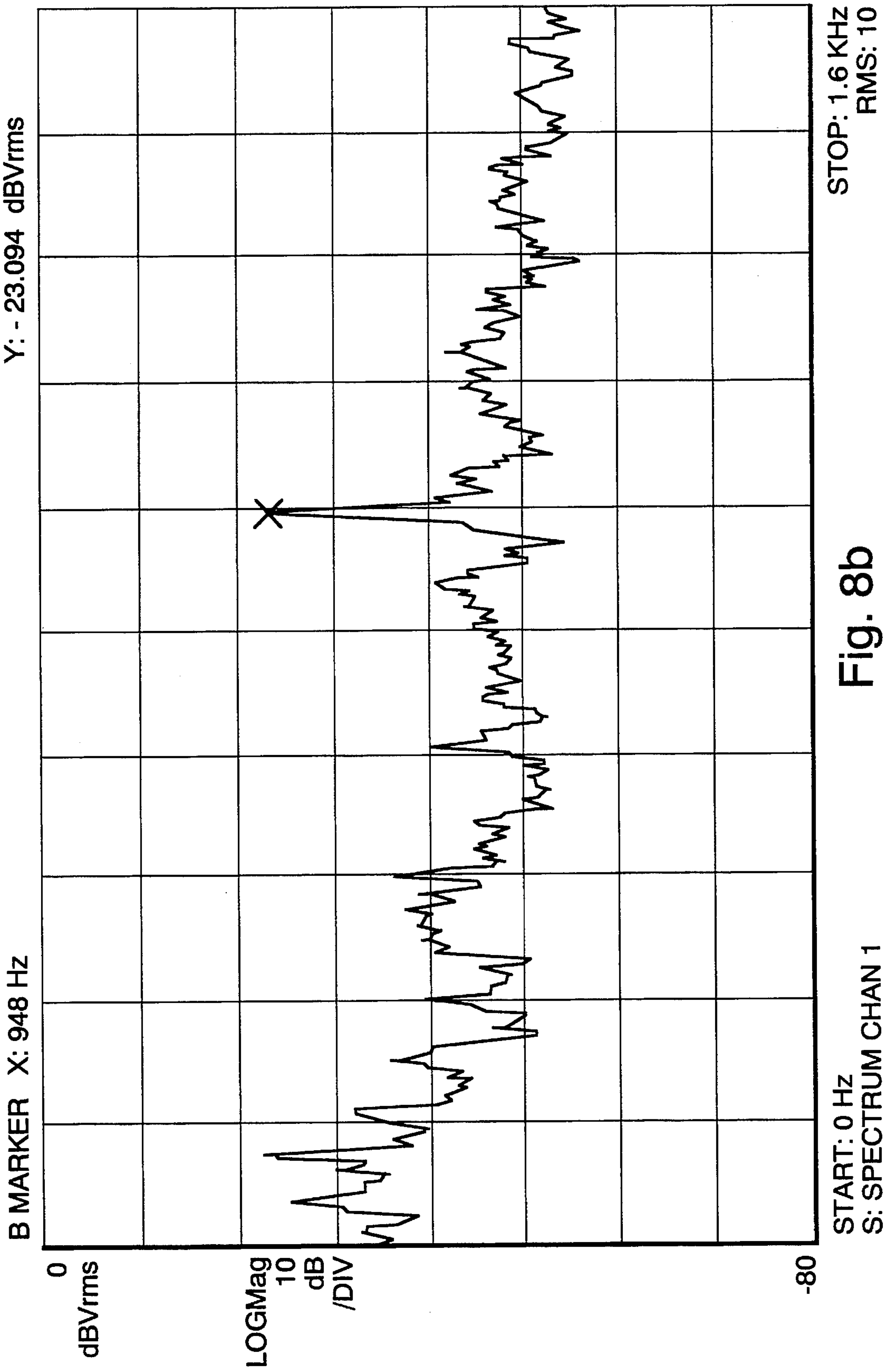

In FIGS. 8 and 8(*a*), there is illustrated a test result for a small forced draft fan illustrating the sound pressure level on a logarithmic scale as against the frequency spectrum. As is indicated, the blade passage frequency in an uncancelled phase is about 948 Hz. In the canceled phase, this tonal component is removed as are tonal components at selected harmonics. This is indicated as the frequencies of 120 Hz and 480 Hz. Also apparent is the reduction of the random noise over the lower part of the frequency spectrum. These test results are set up with the measurement microphone about seven feet from the inlet.

In the illustrated test results shown in FIG. 8, the fan employed a 9⅛ inch diameter inlet and the diameter of the blades was approximately 9½ inches in diameter. The fan had 48 blades and the nominal speed of the motor was 1140 rpm. This provided a nominal blade passage frequency of 912 Hz. The measured blade passage frequency was 948 Hz. and there were also significant tonal components at 120 Hz. and 480 Hz.

Using the paper "Acoustic Mixing in Active Attenuators", G. E. Warnaka and J. Tichy, *Proc-Noise* 80, pp. 683, 688, the contents of which are incorporated by reference herein, the 940 Hz. blade passage tone of the small fan was used to model the 119 Hz blade passage frequency of a much larger fan. By scaling the duct perimeters as given in the referenced paper, a duct 5 inches×5 inches square and 13 inches long was constructed for the model fan. A single cancellation transducer was located on the side of the duct, 5 inches from the inlet phase of the fan. The results of the cancellation noise are shown in the superimposed graphical representations of FIG. 8. The result was that all tones, namely those at 120 Hz., 480 Hz. and 948 Hz. were attenuated to the background level of flow noise. The reduction of noise could also be heard by observers present.

In the result, it is possible to construct short duct active attenuators. In an application for high power forced draft delivery fans and utilities, it is anticipated that the duct would be approximately 56 inches long. This would include about 30 inches of duct already on the inside portion of the fan housing. The characteristics of this fan are the following: fan blade diameter=11.9 ft., number of fan blades=10, two inlets, diameter=7.25 ft. each, fan speed 710–720 rpm.

Active noise control achieves high attenuation of noise in relatively short ducts. In general, the ducts should be proportioned as follows:

1.) Duct length (i.e. the largest longitudinal dimension in the direction of the flow) $<1.5\lambda_m$ or $<2\lambda_m$.

2.) Duct diameter, width, or largest cross-sectional dimension λ

$<m/2$

Where $\lambda_m$ is the wavelength of the highest frequency to be attenuated.

By having the duct extend no longer than about 56 inches in axial length, the characteristic of the duct is that the axial length is about 0.2 to about 3.5 wavelengths relative to the harmonic noise frequencies of the fan operative under essentially steady state conditions.

By having the duct divided into multi-cellular regions and having multiple electronic canceling means 21 associated with each cell, cancellation of noise is facilitated. In different embodiments, more than one speaker can be located in each cell, and the cell number should be less than about 10.

In different cases, the cell numbers should be between about four and twelve cells in each duct.

Although the invention has been described with regard to air flow for a fan, and particularly the reduction of noise in the inlet duct to the fan, it is clear that other configurations could be applicable. In particular, the air flow noise reduction can be in the exhaust or outlet duct from the fan. Although the described embodiments relate to the movement of air, other fluids, for instance, liquids moved by a pump or compressor could also be the subject of noise reduction with the active noise reduction system of the invention. Here the noise generator would be the compressor or pump and the active noise reduction system is directed at reducing noise from them.

Where the invention has applicability to stationary power sources which generate a reasonably stable noise pattern, there are relatively small fluctuations in the steady state operation of the noise generator source. The small fluctuations would essentially mean a variation of the nominal frequency of a few Hz., probably about 10 Hz., to either side of the normal nominal frequency. With such a variation, the controller is operative to effectively cancel noise generated by the noise generator or fan. The application of the invention is applicable to internal combustion engines which are stationarily mounted, other constant speed devices, such as refrigeration compressors, air conditioning fans, gear boxes and vibration transducers.

Once the noise signature of the noise generator has been determined and measured, the electronic controller is embedded with discrete select frequencies and components thereof so as to provide for cancellation signals to the cancellation means as appropriate.

In addition to the applications as described herein to fans and stationary power sources, the invention also has applicability to a wide variety of other noise problems. In fact, any noise source which produces tones or sine waves or harmonic noise can be substantially silenced by utilizing this system appropriately. These applications may include both stationary and moving noise sources. For example, the invention can be used, when appropriately modified, to reduce noise emitted from radiators of large trucks, construction equipment, automobiles, generators, air compressors and the like. Many additional examples may be relayed which can be adapted to the noise reduction system of the present invention. In general, this invention may be utilized to attenuate sources of repetitive or harmonic noise. With regard to attenuating random noise in conjunction with harmonic noise, additional control or loudspeaker systems should be utilized which can be made compatible with the system of the present invention.

The transducers for active noise control consist of input transducers that convert the sound energy of the system into electronic control signals and the cancellation or secondary sources that convert the electrical output of the system into sound waves. The first of these, the input transducers, may be made up of any of a variety of force, pressure, acceleration, velocity, and motion transducers. This group of transducers may be made up of microphones, accelerometers, velocity pickups, linear differential transformers, optical devices, laser systems and infra-red systems, for example.

The cancellation sources provide the acoustic waves of the necessary amplitude and phase to cancel the unwanted noise. As such, they may be made using any appropriate transducing means which may include moving-coil loudspeakers, moving magnet loudspeakers, ionization loudspeakers, wave-radiation loudspeakers, air-modulated loudspeakers, horn loudspeakers and electro-static loudspeakers.

Many other forms of the invention exist, each differing from the other in matters of detail only. The invention is not to be limited by the particular embodiments disclosed. The invention is to be determined in terms of the scope of the following claims.

What is claimed is:

1. An active noise control system for reducing noise of a fan located in a housing comprising duct means related to the housing for directing fluid through the housing, the duct being no greater in length than about 2 wavelengths of the nominal blade passage frequency of the fan operative under essentially steady state conditions, input transducer means for sensing the noise in the duct, cancellation means for attenuating the noise in the duct and an electronic controller means having embedded frequencies, said controller means being responsive to the input transducer means for providing a cancellation signal to the cancellation means.

2. A system as claimed in claim 1 wherein the duct includes means for dividing the duct into multi-cellular cross-sectional regions.

3. A system as claimed in claim 2 wherein the duct has a substantially circular cross-section, and the multi-cellular sections are formed by radial walls directed from a central axis of the duct to the circumference of the duct such that the multi-cellular regions are arranged about the central axis of the duct.

4. A system as claimed in claim 3 wherein the input transducer means and the cancellation means are located circumferentially around the duct, an input transducer means and a cancellation means being arranged for each cell.

5. A system as claimed in claim 2 including a single transducer for each cell and a single cancellation means for each cell, and wherein the transducer means is located in a position further removed from the housing than the location of the cancellation means.

6. A system as claimed in claim 1 wherein the end of the duct means furthest away from the fan has a bell shaped mouth.

7. A system as claimed in claim 1 wherein the frequencies are predetermined discrete frequencies that are the blade passage frequency of the fan and selected harmonics of that frequency.

8. A system as claimed in claim 7 wherein the frequency is the blade passage frequency determined according to the following formula:

Blade Passage Frequency =

-continued $$\frac{\text{fan rotation in RPM} \times \text{No. of blades on fan}}{60}$$

9. A system as claimed in claim 8 wherein the harmonics are at least the second, third and fourth harmonics of the blade passage frequency.

10. A system as claimed in claim 4 wherein the input transducers and the cancellation means are embedded in the circumferential wall of the duct thereby to minimize drag on flow through the duct.

11. A system as claimed in claim 4 wherein the radial walls forming the cells of the duct are constructed to minimize drag on flow through the duct.

12. A system as claimed in claim 1 wherein the duct is the inlet to the housing.

13. A system as claimed in claim 1 wherein the fan is operative under variable conditions and wherein the controller means provides a cancellation signal at predetermined variable frequencies.

14. A system as claimed in claim 7 wherein the fan is operative under variable conditions and wherein the controller means provides a cancellation signal at predetermined variable frequencies.

15. An active noise control system for reducing noise of a fan located in a housing comprising an inlet duct for air through the fan housing, the inlet duct being no greater in length than about 2 wavelengths of the nominal blade passage frequency of the fan operative under essentially steady state conditions, input transducer means for sensing the noise in the inlet duct, cancellation means for attenuating the noise in the duct, and an electronic controller means having embedded frequencies, said controller means being responsive to the input transducer means for providing a cancellation signal to the cancellation means, the inlet duct including means for dividing the duct into multi-cellular cross-sectional inlet regions, the inlet duct having a substantially circular cross-section, and the multi-cellular sections being formed by radial walls directed from a central axis of the duct to the circumference of the duct such that the multi-cellular regions are arranged about the central axis of the duct, a single transducer for each cell and a single cancellation means for each cell, the transducer means being located in a position further removed from the housing than the location of the cancellation means relative to the housing and wherein the controller means provides a cancellation signal at predetermined discrete frequencies.

16. A system as claimed in claim 15 wherein the controller means additionally provides an input signal to the cancellation means to reduce random noise generated by the fan.

17. A system as claimed in claim 15 wherein the input transducers and the cancellation means are embedded in the circumferential wall of the duct thereby to minimize drag on airflow through the duct.

* * * * *